US012628559B2

(12) United States Patent
Wiesepape et al.

(10) Patent No.: US 12,628,559 B2
(45) Date of Patent: May 12, 2026

(54) THERMOELECTRIC CHARGERS EMBEDDED IN THERMALLY INSULATED CONTAINERS AND METHODS OF CHARGING ELECTRONIC DEVICES USING THE SAME

(71) Applicants: Ashlyn Lee Wiesepape, Pearland, TX (US); Nicole Lee Stackhouse, Pearland, TX (US)

(72) Inventors: Ashlyn Lee Wiesepape, Pearland, TX (US); Nicole Lee Stackhouse, Pearland, TX (US)

(73) Assignee: Ashlyn Wiesepape, Pearland, TX (US)

( * ) Notice: Subject to any disclaimer, the term of this patent is extended or adjusted under 35 U.S.C. 154(b) by 0 days.

(21) Appl. No.: 18/659,349

(22) Filed: May 9, 2024

(65) Prior Publication Data

US 2025/0072288 A1 Feb. 27, 2025

Related U.S. Application Data

(63) Continuation of application No. PCT/US2024/027003, filed on Apr. 30, 2024.

(60) Provisional application No. 63/534,189, filed on Aug. 23, 2023.

(51) Int. Cl.
| | |
|---|---|
| *H10N 10/17* | (2023.01) |
| *H02J 7/00* | (2006.01) |
| *H10N 10/01* | (2023.01) |
| *H10N 10/13* | (2023.01) |
| *H10N 19/00* | (2023.01) |

(52) U.S. Cl.
CPC ........... *H10N 10/17* (2023.02); *H02J 7/0045* (2013.01); *H10N 10/01* (2023.02); *H10N 10/13* (2023.02); *H10N 19/00* (2023.02); *H02J 2207/20* (2020.01)

(58) Field of Classification Search
CPC ....... H02J 7/0045; H10N 10/01; H10N 10/13; H10N 19/00; H10N 10/17
See application file for complete search history.

(56) References Cited

U.S. PATENT DOCUMENTS

| | | |
|---|---|---|
| 2008/0283110 A1 | 11/2008 | Jin et al. |
| 2014/0026933 A1 | 1/2014 | Kell et al. |
| 2015/0143818 A1 | 5/2015 | Eckhoff et al. |
| 2022/0090571 A1 | 3/2022 | Ciaccio et al. |

OTHER PUBLICATIONS

Adhithya et al., "Battery Charging Using Thermoelectric Generation Module In Automobiles", IJRET: International Journal of Research in Engineering and Technology, vol. 04 Issue: 03 | Mar. 2015, Available @ http://www.ijret.org (Year: 2015).*

(Continued)

*Primary Examiner* — Tae-Sik Kang
(74) *Attorney, Agent, or Firm* — Rock IP, PLLC

(57) ABSTRACT

The present disclosure provides a thermoelectric charger that includes at least one thermoelectric generator embedded within at least one surface of a thermally insulated container as well as methods for using the same. A benefit of the thermoelectric charger can be providing a portable power source for remote activities that does not depend on sunlight or batteries for power.

13 Claims, 3 Drawing Sheets

(56) References Cited

OTHER PUBLICATIONS

Fjordcarver et al., "Make a Thermopile From Some Copper Wire and Paper Clips", [online], Apr. 28, 2021. Retrieved from the Internet:<URL: https://web.archive.org/web/20210428053044/https://www.instructables.com/Make-a-Thermopile-from-some-Copper-wire-and-Paper-/> (Year: 2021).*

Indira et al., "A review on various configurations of hybrid concentrator photovoltaic and thermoelectric generator system", Solar Energy 201 (2020) 122-148. (Year: 2020).*

Wong et al., "Thermoelectric Generator for Charging Mobile Devices", 2020 IEEE International Conference on Power and Energy (PECon), 29-34. (Year: 2020).*

Mahmoudinezhad et al., "Experimental and numerical investigation of hybrid concentrated photovoltaic e Thermoelectric module under low solar concentration", Energy 159 (2018) 1123-1131. (Year: 2018).*

Wayback Machine, "SP1848-27145 Peltier TEG Module", [online]. Retrieved from the Internet:<URL: https ://web.archive.org/web/20230327015001/https://www.amazon.com/Comimark 40x40mm Thermoelectric Generator SP1848 27145/dp/B07W4PY9CZ>, 2023. (Year: 2023).*

V. S. Konovalova and R. M. Shamsutdinov, "Power supply for electronic gadjets based on thermoelectric effect," 2017 XX IEEE International Conference on Soft Computing and Measurements (SCM), St. Petersburg, Russia, 2017, pp. 308-309, doi: 10.1109/SCM.2017.7970569. (Year: 2017).*

Saha et al, "Photovoltaic (PV) and thermo-electric energy harvesters for charging applications", Microelectronics Journal 96 (2020) 104685. (Year: 2020).*

International Search Report and Written Opinion from Application No. PCT/US24/27003, dated Aug. 8, 2024, 16 pages.

Young Inventors Association of American, Inc., "Photographs of a poster board and experimental prototype," presented on May 13, 2023, at a Young Inventors Showcase, (2929 Buffalo Speedway, #218 Houston, TX 77005), and held at ION District (4201 Main Street Houston, TX 77002), 9 pages.

* cited by examiner

THERMOELECTRIC CHARGERS EMBEDDED IN THERMALLY INSULATED CONTAINERS AND METHODS OF CHARGING ELECTRONIC DEVICES USING THE SAME

CROSS REFERENCE TO RELATED APPLICATIONS

This Application is a continuation of PCT Application No. PCT/US24/27003, filed on Apr. 30, 2024; which claims priority to U.S. Provisional 63/534,189, filed on Aug. 23, 2023, the entirety of which are incorporated by reference.

TECHNICAL FIELD

The present disclosure relates generally to the fields of thermoelectric generators and thermally insulated containers. In particular, the present disclosure provides thermoelectric chargers embedded in thermally insulated containers and methods of charging electronic devices therewith.

BACKGROUND

Typically, electronic devices such as light sources, mobile devices, cell phones, laptops, computer tablets, battery rechargers, batteries, flashlights, etc., are connected to a power grid for charging via power outlets. However, in outdoor environments such as beaches, campsites, picnic and tourist areas, farmlands, forests, lakeshores, etc., power outlets are not conveniently accessible, making it difficult to charge electronic devices in such locations. Power outlets are not portable, requiring users to remain close to the power outlets for the duration of the charging process.

While replaceable batteries provide portability to some extent, each electronic device may have different battery specifications. The lack of flexibility of replaceable batteries requires users to carry multiple batteries for each of the devices. Batteries also have limited capacity and lifespan. Therefore, batteries are not suitable applications where users would spend long periods of time away from the power grid. On the other hand, mechanical or fuel-based generators are noisy, bulky, and impractical for charging electronic devices.

Photovoltaic cells (solar panels) have been proposed as a solution for providing portable charging stations. However, photovoltaic cells can be unreliable. In bad weather conditions, such as cloudy days, photovoltaic cells cannot generate electricity to charge electronic devices. In addition, photovoltaic cells cannot be used after the sunset, such as when camping overnight. In addition, solar panels are not conveniently portable as they can take up a large amount of space.

Therefore, it is desirable to develop new and improved chargers and methods of charging electronic devices that may alleviate, at least in part, the above limitations associated with the conventional solutions.

SUMMARY

The present disclosure addresses these and other unmet deficiencies inherent in the relevant thermoelectric arts, by providing thermoelectric chargers coupled with thermally insulated containers as well as methods of charging electronic devices that are portable, versatile, reliable, and consume a small spatial footprint compared to existing solutions.

The present disclosure provides a thermoelectric charger. In some embodiments, a thermoelectric charger includes at least one thermoelectric generator embedded within at least one surface of a thermally insulated container; wherein the at least one thermoelectric generator is electrically connected to a power converter; and wherein the power converter is electrically connected to a power port; wherein the thermally insulated container includes a container top, a container bottom, and at least one container side, and the at least one surface includes a container inner surface and a container outer surface; and wherein at least a portion of the container top is or can be reversibly sealed to the thermally insulated container.

In some embodiments, the at least one thermoelectric generator includes from 1 thermoelectric generator to about 20 thermoelectric generators. In some embodiments, the at least one thermoelectric generator includes an array of thermoelectric generators from 2 thermoelectric generators to about 10 thermoelectric generators electrically connected in series to the power converter. In some embodiments, the at least one thermoelectric generator includes an array of thermoelectric generators from 3 thermoelectric generators to about 8 thermoelectric generators electrically connected in series to the power converter.

In some embodiments, the at least one thermoelectric generator includes at least one n-type semiconductor and at least one p-type semiconductor located between a heat source ceramic material and a heat sink ceramic material, and the heat sink ceramic material is a portion of the container inner surface and the heat source ceramic material is a portion of the container outer surface. In some embodiments, the heat sink ceramic material is an inner most portion of the container inner surface. In some embodiments, the heat source ceramic material is an outer most portion of the container outer surface. In some embodiments, the heat sink ceramic material is positioned directly beneath at least a layer of the inner most portion of the container inner surface. In some embodiments, the heat source ceramic material is positioned directly beneath an outer most layer of the container outer surface.

In some embodiments, the at least one thermoelectric generator includes at least one n-type semiconductor and at least one p-type semiconductor located between a heat source ceramic material and a heat sink ceramic material, and the heat source ceramic material is a portion of the container inner surface and the heat sink ceramic material is a portion of the container outer surface. In some embodiments, the heat source ceramic material is an inner most portion of the container inner surface. In some embodiments, the heat sink ceramic material is an outer most portion of the container outer surface. In some embodiments, the heat source ceramic material is positioned directly beneath at least a layer of the inner most portion of the container inner surface. In some embodiments, the heat sink ceramic material is positioned directly beneath an outer most layer of the container outer surface.

In some embodiments, the power converter includes a direct current (DC)-DC power converter. In some embodiments, the DC-DC power converter has an input range of from about 0.01 V to about 12 V. In some embodiments, the DC-DC power converter has an input range of from about 0.01 V to about 6 V. In some embodiments, the DC-DC power converter has an input range of from about 0.01 V to about 3 V.

In some embodiments, the power port includes one or more of a power socket, a power plug, a power charger, a power adapter, a power cord, a battery charger, or a power outlet, or a universal serial bus (USB) port, or combinations thereof.

In some embodiments, the container bottom connects to the at least one container side and the container bottom and the at least one container side are impermeable to an aqueous fluid. In some embodiments, at least one of the container bottom and the at least one container side include a container inner material, a container outer material, and a thermally insulating layer located between the container inner material and the container outer material. In some embodiments, the thermally insulated container is impermeable to the aqueous fluid when the at least a portion of the container top is reversibly sealed to the thermally insulated container.

In some embodiments, the at least one thermoelectric generator includes an array of thermoelectric generators. In some embodiments, the array of thermoelectric generators includes from 2 thermoelectric generators to about 8 thermoelectric generators electrically connected in series and a closed loop to the power converter. In some embodiments, the array of thermoelectric generators, or a portion of the array of thermoelectric generators, is embedded in the container top, the container bottom, or the at least one container side.

In some embodiments, the at least one thermoelectric generator includes an array of thermoelectric generators, wherein at least half of the array of thermoelectric generators have a shape of rectangular tiles having a length of about 10.0 to about 100.0 mm, a width of about 10.0 to about 100.0 mm, and a height of about 3.0 mm to about 8.0 mm. In some embodiments, the array of thermoelectric generators is capable of generating a voltage of about 3.0 V to about to about 8.0 V at 30° C., with a 50° C. difference in temperature between a content of the thermally insulated container and an ambient environment.

The present disclosure further provides methods of charging electronic devices. In some embodiments, the method includes providing a thermoelectric charger, wherein the thermoelectric charger includes providing a thermoelectric charger, wherein the thermoelectric charger includes at least one thermoelectric generator embedded within at least one surface of a thermally insulated container; wherein the at least one thermoelectric generator is electrically connected to a power converter; and wherein the power converter is electrically connected to a power port; wherein the thermally insulated container includes a container top, a container bottom, and at least one container side, and the at least one surface includes a container inner surface and a container outer surface; and wherein at least a portion of the container top is or can be reversibly sealed to the thermally insulated container; electrically connecting the electronic device to the power port; and providing a temperature differential of from about 50° C. to about 80° C. between the container inner surface and the container outer surface by contacting the container inner surface with a substance.

In some embodiments, the substance is a hot substance having a temperature ranging from about 75.0° C. to about 102.0° C. In some embodiments, the substance is a hot substance that includes an aqueous solution having a temperature ranging from about 80.0° C. to about 102.0° C. In some embodiments, the substance is a cold substance having a temperature ranging from about –11° C. to about 25.0° C. In some embodiments, the substance is a cold substance that includes an aqueous solution or aqueous slurry having a temperature ranging from about –5.0° C. to about 25.0° C. In some embodiments, the electronic device is one or more of a light source, a mobile device, a cell phone, a laptop, a computer tablet, a battery recharger, a battery, a flashlight, or a combination thereof.

BRIEF DESCRIPTION OF THE DRAWINGS

The foregoing summary, as well as the following detailed description of the embodiments, will be better understood when read in conjunction with the attached drawings. For the purpose of illustration, there are shown in the drawings some embodiments, which may be preferable. It should be understood that the embodiments depicted are not limited to the precise details shown. Unless otherwise noted, the drawings are not to scale.

DETAILED DESCRIPTION

Figure 1:
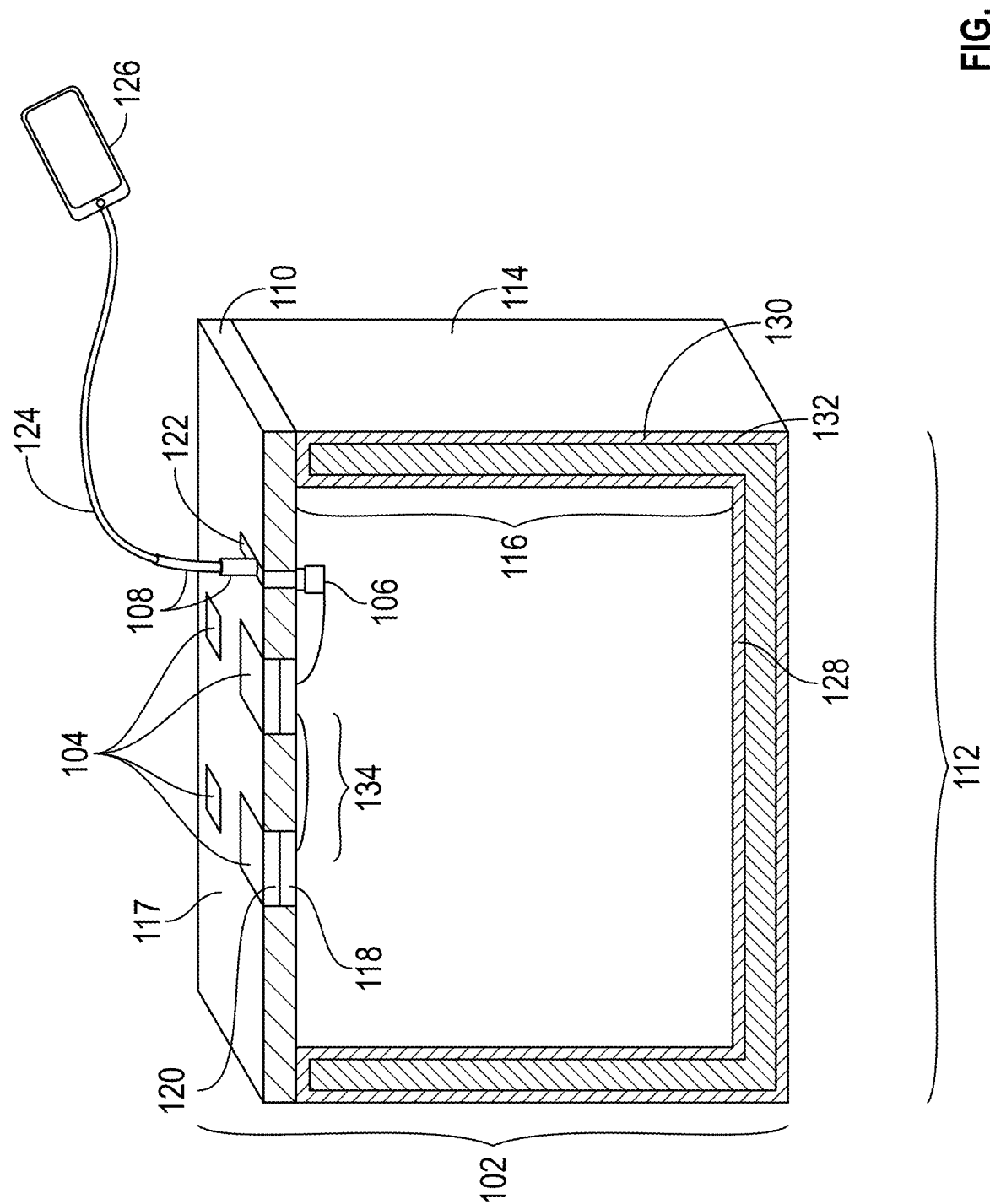
FIG. 1 shows a schematic depiction of a cut away view of a charging device with a thermoelectric charger embedded in a thermally insulating container.

Unless otherwise noted, all measurements are in standard metric units. Unless otherwise noted, all instances of the words "a," "an," or "the" can refer to one or more than one of the word that they modify.

Unless otherwise noted, the term "about" refers to ±0.1 of the dimension number that is described. For example, when the term "about" is discussed in terms of a range, then the term refers to the appropriate amount less than the lower limit and more than the upper limit. For example, from about 0.64 cm to about 1.27 cm can include from 0.54 cm to 1.37 cm.

Unless otherwise noted, a range of numbers includes all numbers in that range. For example, the range of 0.01 V to about 12 V includes 0.05, 0.1, 0.5, 1, 2, 3.5, 5, 6.75, 8.5, 10 and any sub range therein.

Unless otherwise noted, the phrase "at least one of" means one or more than one of an object. For example, "at least one of the container bottom and the at least one container side include a container inner material, a container outer material, and thermally insulating layer located between the container inner material and the container outer material" means a single container side, a two container sides, three or more container sides, and/or the container bottom, or any combination thereof.

The term "for example" or "e.g.," as used herein, is used merely by way of example, without limitation intended, and should not be construed as referring to only those items explicitly enumerated in the specification.

The term "thermoelectric generators" refers to devices that can convert thermal energy into electrical energy through a thermoelectric effect.

The term "thermally insulated container" refers to a container having a volume capacity of less than or equal to 1 cubic meter and capable of maintaining a temperature difference between the interior of the container and the ambient environment of 20° C. or more for 2 hours without access to a power source.

Unless otherwise noted, the terms "provide", "provided" or "providing" refer to the supply, production, purchase, manufacture, assembly, formation, selection, configuration, conversion, introduction, addition, or incorporation of any element, amount, component, reagent, quantity, measurement, or analysis of any method or system of any embodiment herein.

Unless otherwise noted, the term "portable" means having a weight (mass) of less than or equal to 45.0 kg.

Unless otherwise noted, all measurements are in standard metric units.

Unless otherwise noted, properties (height, width, length, ratio etc.) as described herein are understood to be averaged measurements.

Numerous systems and processes have been reported for charging electronic devices. However, existing solutions suffer from accessibility constraints due to lack of portability, lack of compact and simple designs, and lack of compatibility challenges with a plurality of electronic devices having different specifications and hardware configurations, etc. Conventional solutions such as photovoltaic cells, while providing some portability, have been found to be unreliable due to heavy cloud cover and are highly dependent upon the angle of the sun during charging, including performing poorly during sunrise and sunset. Of course, solar panels are useless at night.

While thermoelectric power generators are known, they are generally used to provide power based for large scale needs, such as providing electricity from thermal vents in subterranean environments. While smaller thermoelectric generators are known, the conventional thinking has been that they need to be very large to provide enough power to do anything useful, which makes those thermoelectric generators non-portable. Conventional thermoelectric generator chargers utilizing thermoelectric generators have not been found to generate a potential sufficient to charge electronic devices.

Also, larger thermoelectric generators would be impractical for portable charging because many thermoelectric generators rely on ceramic plates that are brittle and easily damaged, such that they would not be small enough or rugged enough to make them practical for use in portable chargers. Even if the conventional thermoelectric generators were portable and rugged, the conventional thinking was that the source of the difference in temperature could not be portable, much less reliable for charging electronic devices.

Against all of this conventional thinking, the present disclosure solves the above-mentioned problems associated with conventional charging systems and processes by providing a thermoelectric charger that includes one or more thermoelectric generators, which generate electric current by utilizing temperature differences between ambient environments and the interiors of thermally insulated containers.

In some embodiments of the thermoelectric charger, the above-mentioned challenges are overcome by embedding or fixing small thermoelectric generators into the surface of portable thermally insulated containers. In some embodiments, the thermoelectric charger solves the challenge of providing and maintaining a mobile or portable difference in temperature between the interior of the thermally insulated containers and the ambient environment by embedding thermoelectric charges into the surface of portable thermally insulated containers. A benefit of the thermoelectric chargers disclosed herein can be that the thermoelectric generators are embedded into portable objects, thermally insulated containers, that are already commonly transported to remote locations, such as a cooler for storing food and drink or a thermos for storing coffee or soup.

In some embodiments of the thermoelectric charger, the charger overcomes the challenge of low power conversion efficiency and brittleness of thermoelectric generators by embedding or fixing multiple small panels into the surface of thermally insulated containers. This arrangement provides thermoelectric generators small enough to be embedded into a small portable thermally insulated container. Plus, the surface area can be small enough to avoid the brittleness and loss of toughness associated with large area ceramic panels.

Further, it had been discovered that the use of small thermoelectric generators was insufficient to generate enough voltage to recharge electric devices or even to work with conventional power converters, which had a minimum threshold value of 6 V. It was further discovered that if enough small thermoelectric generators were electrically connected in a closed loop with a power converter having no minimum or a minimum threshold voltage of 3 V, then enough voltage could be provided by the array of thermoelectric generators to power an electronic device, such as a light or a cell phone.

Without wishing to be bound by theory, it may be appreciated by skilled artisans that when a temperature gradient is provided between a junction formed between two dissimilar conductive materials, an electromotive force (emf) or voltage proportional to the temperature gradient is developed therebetween. The difference in potential causes electrons to move, thereby generating an electric current. The present disclosure utilizes the aforesaid to charge electronic devices. Embodiments of the thermoelectric chargers provide temperature gradients by storing substances in a thermally insulated container that are hotter or colder than the external ambient environment. The conductive materials forming the thermoelectric generators are then configured such that one conductive surface is exposed to the interior of the container while the other conductive surface is exposed to the exterior of the container, thereby creating a temperature difference at the junction therebetween to generate electric currents. In other words, for embodiments of the thermoelectric charger to function, the at least one thermoelectric generator embedded within at least one surface of a thermally insulated container should be embedded into the surface of the thermally insulated container such that a heat source side of the thermoelectric generator is exposed to the hotter source of temperature and the heat sink side of the thermoelectric generator is exposed to the cooler source of temperature. This exposure may mean direct contact or thermal contact through a thin material that allows for a temperature gradient to be passed through the material of the thin material while allowing the thin material to be water tight and to provide protection against impacts and abrasions.

FIG. 1 illustrates a schematic depiction of a thermoelectric charger with a cross-section view of a thermally insulated container associated therewith. As can be seen from FIG. 1, the thermoelectric charger 100 comprises a thermally insulated container 102 having at least one thermoelectric generator 104 embedded on at least one surface in said thermally insulated container 102. The at least one thermoelectric generator 104 is electrically connected to a power port 108 via a power converter 106. In some embodiments, the power converter 106 may be a direct current (DC)-DC power converter with an input range of from about 0.01 V to about 12 V. The at least one thermoelectric generator 104 is configured to generate electric currents when a temperature difference is caused between two surfaces associated therewith.

Referring to FIG. 1, the thermally insulated container 102 includes a container top 110, a container bottom 112, and at least one container side 114. In some embodiments, as shown in FIG. 1, the at least one thermoelectric generator 104 is embedded into the container top 110. The at least one surface of the thermally insulated container 102 includes a container inner surface 116 and a container outer surface 117. In embodiments shown in FIG. 1, the thermally insulated container 102 also comprises a heat sink ceramic material 118 and a heat source ceramic material 120 which are portions of the container inner surface 116 and the container outer surface 117, respectively. The thermally insulated container 102 further comprises a container inner material 128, a container outer material 130, and a thermally insulating layer 132 that insulates the interior of the container 102 from the external environment.

In some embodiments, the at least one thermoelectric generator 104 is disposed between the heat sink ceramic material 118 and the heat source ceramic material 120 such that at least one surface of the thermoelectric generator 104 is exposed to the interior of the container 102 via the heat sink ceramic material 118 and at least one surface of the thermoelectric generator 104 is exposed to the ambient environment via the heat source ceramic material 120. In such embodiments, since the temperature inside the container 102 is lower than the temperature of the ambient environment, the temperature difference therebetween causes the at least one thermoelectric generator 104 to produce an electric current. The electric current so generated is passed through electrical connections 134 to the power converter 106 and made available through the power port 108 for charging an electronic device, such as a cellphone 126. In some embodiments, the container inner surface 116 and the container outer surface 117 are also adapted to withstand external stress and prevent damage to the at least one thermoelectric generator 104, by having the surface of the thermoelectric generator recessed below the level of the container inner surface 116 and the container outer surface 117.

In some embodiments, the thermally insulated container has a substantially cuboidal contour. Further, this design of container (heat sink ceramic material facing the interior) is compatible with any one or combination of cold storage boxes, insulated flasks, and the like, but not limited to the same, that retains the temperature of a cold substance. The container is insulated such that the temperature in the interior of the container is lower than the ambient temperature outside the container.

FIG. 1 also illustrates a Universal Serial Bus (USB) port 122 coupled to the power port 108 such that an exemplary electronic device, such as a cellphone 126, may be charged by the thermoelectric charger 100. The electric current regulated by the power converter 106 is supplied to the electronic device (e.g., 126) via the USB port 122. A power adapter 124 is electrically connected to the USB port 122 to allow the electric current to be supplied to the cellphone 126. It may be appreciated by skilled artisans that the power port 108 and the USB port 122 may be suitably adapted based on specifications, hardware configurations, and charging requirements of the electronic device (e.g., 126).

Figure 2:
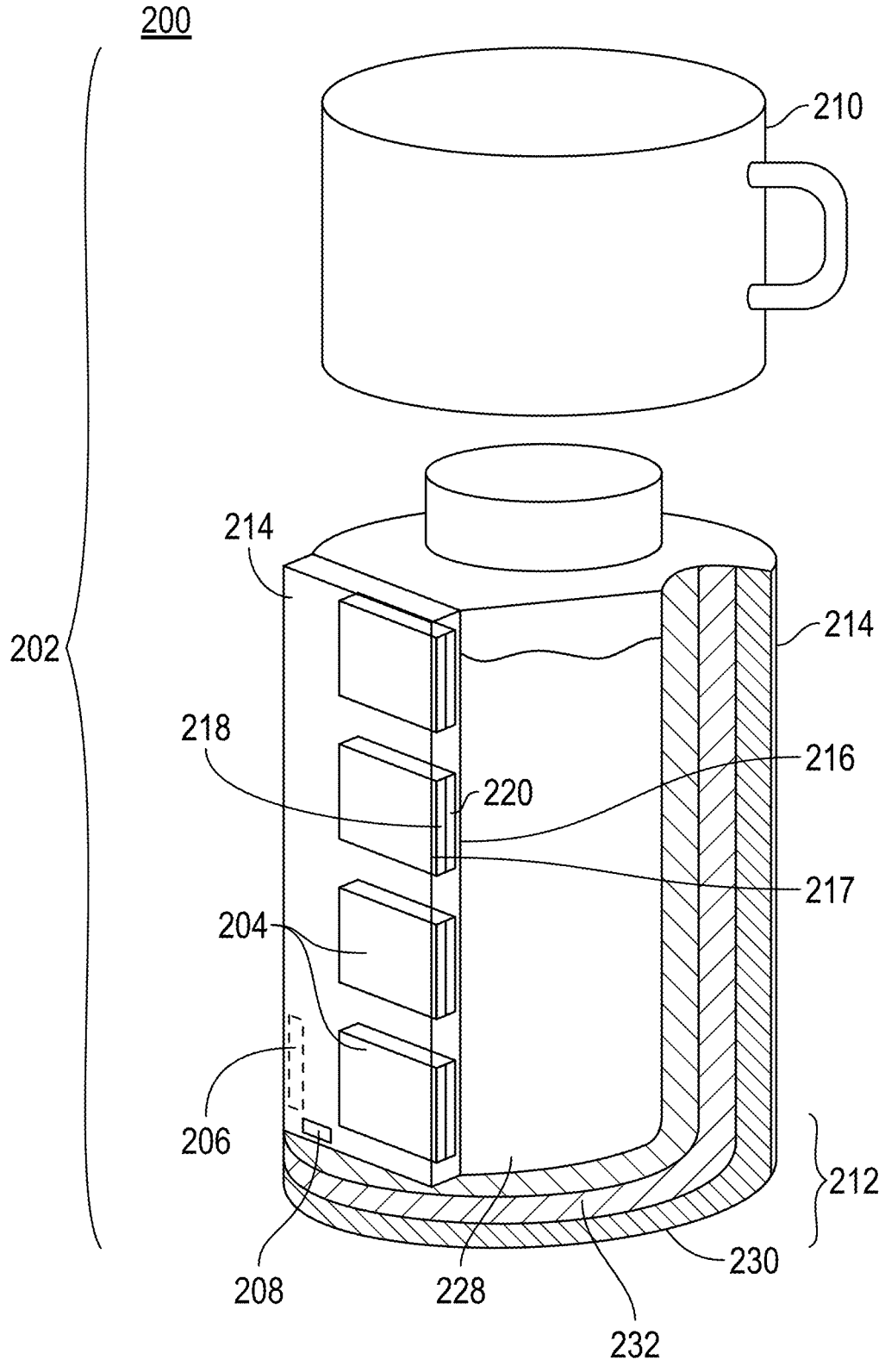
FIG. 2 shows a schematic depiction of a cut away view of a charging device with thermoelectric chargers embedded in a thermally insulating container with the top of the container removed.

FIG. 2 shows a cross-sectional view of the thermoelectric charger with a container top removed. As shown in FIG. 2, the thermoelectric charger 200 comprises a thermally insulated container 202. The thermally insulated container 202 includes a container top 210, a container bottom 212, and at least one container side 214. A surface of the thermally insulated container 202 includes a container inner surface

216 and a container outer surface 217. The thermally insulated container 202 further comprises a container inner material 228, a container outer material 230, and a thermally insulating layer 232 that insulates the interior of the thermally insulated container 202 from the external environment.

In some embodiments, at least a portion of the container top 210 is reversibly sealed to the thermally insulated container 202. In some embodiments as shown in FIG. 2, at least one thermoelectric generator 204 is configured at the container side 214. In some embodiments, the thermally insulated container 202 has a substantially cylindrical contour. In some embodiments, the thermally insulated container 202 is any one or combination a hot storage box, insulated flasks, and the like, but not limited to the same, that retains the temperature of a hot substance. The thermally insulated container 202 is insulated such that the temperature in the interior of the thermally insulated container 202 is higher than the ambient temperature outside the thermally insulated container 202.

In some embodiments, the at least one thermoelectric generator 204 is disposed between a heat sink ceramic material 218 and a heat source ceramic material 220 such that at least one surface of the thermoelectric generator 204 is exposed (directly or thermally) to the interior of the thermally insulated container 202 via the heat source ceramic material 220 and at least one surface of the thermoelectric generator 204 is exposed to the ambient environment via the heat sink ceramic material 218. In such embodiments, since the temperature inside the thermally insulated container 202 is higher than the temperature in the ambient environment, the temperature difference therebetween causes the at least one thermoelectric generator 204 to generate an electric current. The electric current so generated is passed through a power converter 206 and made available through a power port 208 for charging electronic devices.

Figure 3:
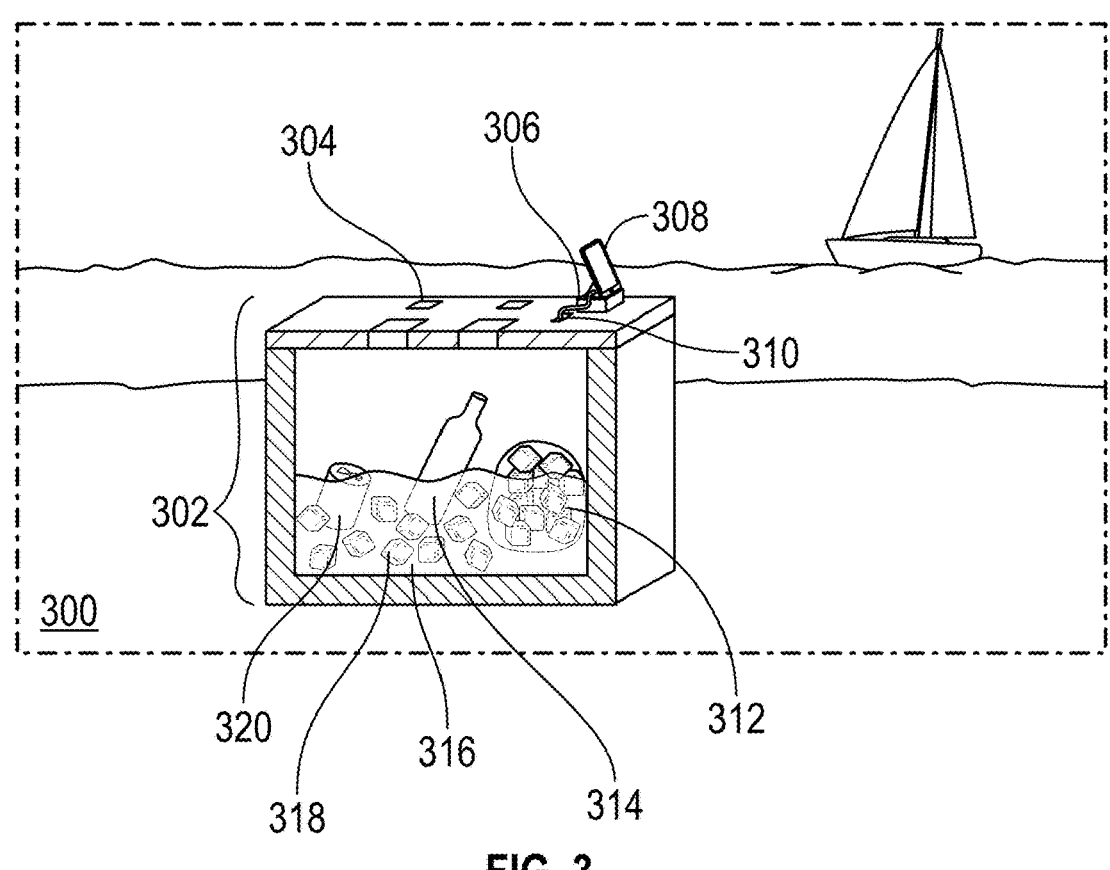
FIG. 3 shows exemplary an implementation of a thermoelectric charger embedded in a thermally insulating container being used to a charge electronic device.

Referring to FIGS. 1 and 3, FIG. 3 shows exemplary implementations of a thermoelectric charger 302 such as the charger shown in FIG. 1, that may be used on a beach 300, wherein the ambient external temperature is greater than the temperature inside of the thermally insulated container 102 associated with the thermoelectric charger 302. To further increase the temperature difference between the interior and the exterior of the container, cold substances including, but not limited to, ice 318, a bag of ice 312, cold water 316, soda 320, beer 314, and the like, can be stored inside the thermally insulated container. The thermally insulated layers of the container maintain the temperature of the cold substances placed in the container. In such embodiments, the heat sink ceramic material 118 on the inner surface of the container is exposed to colder temperature created by the cold substance, and the heat source ceramic material 120 is exposed to the comparatively hotter temperature in the ambient environment. The at least one thermoelectric generator 304 disposed between the heat sink ceramic material 118 and the heat source ceramic material 120 generates electric currents based on the temperature difference between said ceramic materials. As shown, a cell phone 308 on a cell phone stand 306 may be connected to the thermoelectric charger 302 via the power port 310 with the at least one thermoelectric generator 304 supplying an electric current therethrough for charging.

Figure 4:
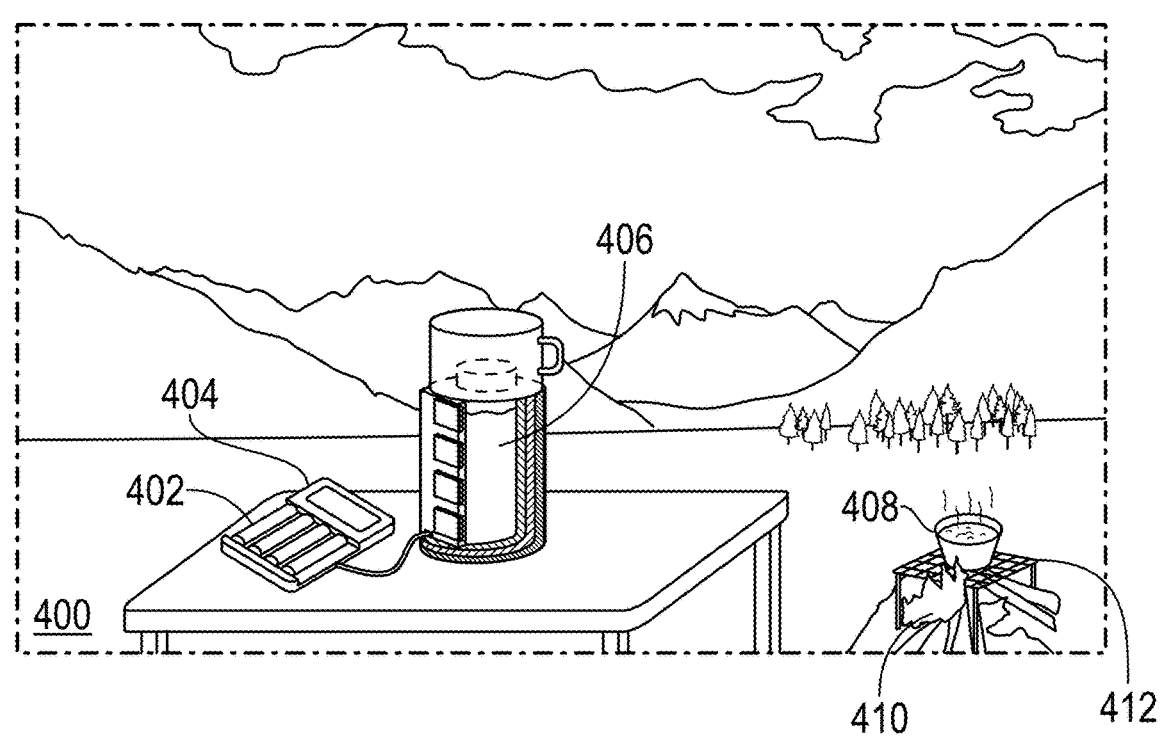
FIG. 4 shows exemplary an implementation of a thermoelectric charger embedded in a thermally insulating container being used to charge an electronic device.

Referring to FIGS. 2 and 4, FIG. 4 further shows an exemplary implementation of a thermoelectric charger 200 as illustrated in FIG. 2, that may be used during camping or glamping 400, wherein the ambient external temperature is less than the temperature inside the thermally insulated container 202. To further increase the temperature difference between the interior and the exterior of the container, hot substances including, but not limited to, coffee 406, hot beverages, boiling water, and the like, may be stored inside the thermally insulated container 202. A continuous supply of hot water 408 can be safely provided by, for example, a fire 410 in a fire pit 412. The thermally insulated layers 232 of the container maintain the temperature of the hot substances placed in the container 202. In such embodiments, the heat source ceramic material 220 on the inner surface of the container is exposed to the hotter temperature environment created by the hot substance, and the heat sink ceramic material 218 is exposed to the comparatively colder temperature in the ambient environment. The at least one thermoelectric generator 204 disposed between the heat sink ceramic material 218 and the heat source ceramic material 220 generate electric currents proportionate to the temperature difference between said ceramic materials. As shown, one or more rechargeable batteries 402 may be connected to a battery charger 404, which is connected to the thermoelectric charger 200 via the power port 208 with the at least one thermoelectric generator 204 supplying an electric current therethrough for recharging.

Therefore, in accordance with some embodiments of the present disclosure, there is provided a thermoelectric charger, which includes at least one thermoelectric generator, or an array of thermoelectric generators, embedded within at least one surface of a thermally insulated container, wherein the at least one thermoelectric generator is electrically connected to a power converter, and wherein the power converter is electrically connected to a power port. In some embodiments, the thermally insulated container includes a container top, a container bottom, and at least one container side. In some embodiments, at least a portion of the container top is reversibly sealable to the thermally insulated container. In some embodiments, the at least one surface includes a container inner surface and a container outer surface.

In some embodiments, the at least one thermoelectric generator includes from 1 thermoelectric generator to about 20 thermoelectric generators. In some embodiments, the at least one thermoelectric generator includes an array of thermoelectric generators that includes from 2 thermoelectric generators to about 10 thermoelectric generators electrically connected in series to the power converter. In some embodiments, the at least one thermoelectric generator includes an array of thermoelectric generators from 3 thermoelectric generators to about 8 thermoelectric generators electrically connected in series to the power converter. In some embodiments, the at least one thermoelectric generator includes an array of thermoelectric generators electrically connected in series to the power converter, including from about 1 to about 15 thermoelectric generators or from about 2 to about 15 thermoelectric generators, or from about 2 to about 8 thermoelectric generators, or from about 3 to about 10 thermoelectric generators.

In some embodiments, the at least one thermoelectric generator includes at least one n-type semiconductor and at least one p-type semiconductor located between a heat source ceramic material and a heat sink ceramic material, and the heat sink ceramic material is a portion of the container inner surface and the heat source ceramic material is a portion of the container outer surface. In some embodiments, the heat sink ceramic material is an inner most portion of the container inner surface. In some embodiments, the heat source ceramic material is an outer most portion of the container outer surface. In some embodiments, the heat sink ceramic material is positioned directly beneath at least a layer of the inner most portion of the container inner surface. In some embodiments, the heat source ceramic material is positioned directly beneath an outer most layer of the container outer surface. A benefit of having an inner most layer or outermost layer over the ceramic material of the thermoelectric generators can be the ability to protect the thermoelectric generator from damage and/or to make the container impermeable to liquids or gasses and/or to make cleaning easier and/or to avoid passing an undesirable taste to a beverage, such as coffee, in the container.

In some embodiments, the heat source ceramic material is a portion of the container inner surface and the heat sink ceramic material is a portion of the container outer surface. In some embodiments, the heat source ceramic material is an inner most portion of the container inner surface. In some embodiments, the heat sink ceramic material is an outer most portion of the container outer surface. In some embodiments, the heat source ceramic material is positioned directly beneath at least a layer of the inner most portion of the container inner surface. In some embodiments, the heat sink ceramic material is positioned directly beneath an outer most layer of the container outer surface.

A benefit of having an inner most layer or outermost layer over the ceramic material of the thermoelectric generators can be the ability to protect the thermoelectric generator from damage and/or to make the container impermeable to liquids or gasses and/or to make cleaning easier and/or to avoid passing an undesirable taste to a beverage, such as coffee, in the container.

In some embodiments, the power converter includes a DC-DC power converter. In some embodiments, the DC-DC power converter has an input range of from about 0.01 V to about 12 V. In some embodiments, the DC-DC power converter has an input range of from about 0.01 V to about 6 V. In some embodiments, the DC-DC power converter has an input range of from about 0.01 V to about 3 V. In some embodiments, the power converter has an input range from about 0.01 V to about 11 V, or from about 0.01 V to about 10 V, or from about 0.01 V to about 9 V, or from about 0.01 V to about 8 V, or from about 0.01 V to about 7 V, or from about 0.01 V to about 5 V, or from about 0.01 V to about 4 V.

In some embodiments, as discussed herein, the power port includes one or more of a power socket, a power plug, a power charger, a power adapter, a power cord, a battery charger, or a power outlet, or a USB port, or combinations thereof. It may be appreciated by skilled artisans that the power port may be suitably adapted based on specifications, hardware configurations, and charging requirements of the electronic device.

In some embodiments, the container bottom connects to the at least one container side, and the container bottom and the at least one container side are impermeable to an aqueous fluid. In some embodiments, at least one of the container bottom and the at least one container side include a container inner material, a container outer material, and a thermally insulating layer located between the container inner material and the container outer material. In some embodiments, the thermally insulated layer is any one or combination of aero-gels, glass-ceramic composites, wool, fiber glass, silicone, and resin, but not limited to the same. In some embodiments, the thermally insulated container is impermeable to an aqueous fluid when the at least a portion of the container top is reversibly sealed to the thermally insulated container.

In some embodiments, the at least one thermoelectric generator includes an array of thermoelectric generators. In some embodiments, the array of thermoelectric generators includes from 2 thermoelectric generators to about 8 thermoelectric generators electrically connected in series and a closed loop to the power converter. In some embodiments, the at least one thermoelectric generator includes an array of thermoelectric generators electrically connected in series and a closed loop to the power converter includes from about 2 to about 8 thermoelectric generators, or from about 2 to about 7 thermoelectric generators, or from about 3 to about 6 thermoelectric generators, or from about 4 to about 5 thermoelectric generators. In some embodiments, the array of thermoelectric generators, or a portion of the array of thermoelectric generators, is embedded in the container top, the container bottom, or the at least one container side. In such embodiments, the array of thermoelectric generators may be configured such that the side of the thermoelectric generators having the heat sink ceramic material is substantially exposed to the interior of the container and the side of the thermoelectric generators having the heat source is substantially exposed to the exterior of the container. In some embodiments, the array of thermoelectric generators may be configured such that the side of the thermoelectric generators having the heat sink ceramic material is substantially exposed to the exterior of the container and the side of the thermoelectric generators having the heat source is substantially exposed to the interior of the container.

In some embodiments, the at least one thermoelectric generator includes an array of thermoelectric generators, wherein at least half of the array of thermoelectric generators have a shape of rectangular tiles having a length of about 10.0 to about 100.0 mm, a width of about 10.0 to about 100.0 mm, and a height of about 3.0 mm to about 8.0 mm. In some embodiments, the array of thermoelectric generators is capable of generating a voltage of about 3.0 V to about to about 8.0 V at 30° C., with a 50° C. difference in temperature between a content of the thermally insulated container and an ambient environment. Other thermoelectric generators from the array of thermoelectric generators may have a plurality of shapes and dimensions suitably adapted for embedding within the container along with the thermoelectric generators having substantially rectangular contour.

In some embodiments, the thermoelectric charger may be used in conjunction with chargers having photovoltaic cells for charging the electronic devices. A benefit of this design can be providing multiple sources of power.

The present disclosure further provides a method of charging an electronic device. In some embodiments, the method includes providing a thermoelectric charger, wherein the thermoelectric charger includes at least one thermoelectric generator embedded within at least one surface of a thermally insulated container. In some embodiments of the method, the at least one thermoelectric generator is electrically connected to a power converter. In some embodiments of the method, the power converter is electrically connected to a power port. In some embodiments of the method, the thermally insulated container includes a container top, a container bottom, and at least one container side, and the at least one surface includes a container inner surface and a container outer surface. In some embodiments of the method, at least a portion of the container top is reversibly sealable or sealed to the thermally insulated container.

In some embodiments of the method, the method further includes electrically connecting the electronic device to the power port, and providing a temperature differential of from about 50° C. to about 80° C. between the container inner surface and the container outer surface by contacting the container inner surface with a substance. In some embodiments, the temperature differential provided between the container inner surface and the container outer surface is from about 55° C. to about 80° C. or from about 55° C. to about 75° C. or from about 60° C. to about 75° C. or from about 60° C. to about 70° C. Generally, the greater the difference in temperature between the ambient environment and the container interior, the large the voltage possible.

In some embodiments, the substance is a hot substance having a temperature ranging from about 75.0° C. to about 102.0° C. In some embodiments, the substance is a hot substance that includes an aqueous solution having a temperature ranging from about 75.0° C. to about 97.0° C. In some embodiments, the temperature of the hot substance ranges from about 80° C. to about 92° C. or from about 85° C. to about 87° C. In some embodiments, the substance is a cold substance having a temperature ranging from about −11° C. to about 25.0° C. In some embodiments, the substance is a cold substance that includes an aqueous solution or aqueous slurry having a temperature ranging from about −5.0° C. to about 25.0° C. In some embodiments, the temperature ranges from about −5° C. to about 20° C. or from about 0° C. to about 20° C. or from about 5° C. to about 15° C. or from about 10° C. to about 15°.

In some embodiments, the electronic device may include, but not be limited to, a light source, a mobile device, a cell phone, a laptop, a computer tablet, a battery recharger, a battery, a flashlight, or a combination thereof.

In some embodiments, the thermoelectric charger of the present disclosure provides a portable electric charger that reliably generates electric current in any weather condition or time of day or night. The thermoelectric charger of the present disclosure also allows for charging of a plurality of electronic devices. By providing a universal charging solution, the thermoelectric charger eliminates the need for carrying multiple batteries with different specifications, thereby streamlining the charging process for users. The convenient portability of the thermoelectric charger allows users to easily carry it during outdoor activities, addressing the limitations of existing solutions.

More Embodiments

Embodiment 1: A thermoelectric charger comprising:
at least one thermoelectric generator embedded within at least one surface of a thermally insulated container;
wherein the at least one thermoelectric generator is electrically connected to a power converter; and
wherein the power converter is electrically connected to a power port;
wherein the thermally insulated container includes a container top, a container bottom, and at least one container side, and the at least one surface includes a container inner surface and a container outer surface; and
wherein at least a portion of the container top can be reversibly sealed to the thermally insulated container.
Embodiment 2. The thermoelectric charger of one or more of embodiments 1-11,
wherein the at least one thermoelectric generator includes from 1 thermoelectric generator to about 20 thermoelectric generators, or wherein the at least one thermoelectric generator includes an array of thermoelectric generators of from 2 thermoelectric generators to about 10 thermoelectric generators electrically connected in series to the power converter, or wherein the at least one thermoelectric generator includes an array of thermoelectric generators of from 3 thermoelectric generators to about 8 thermoelectric generators electrically connected in series to the power converter.

Embodiment 3. The thermoelectric charger of one or more of embodiments 1-11, wherein the at least one thermoelectric generator includes at least one n-type semiconductor and at least one p-type semiconductor located between a heat source ceramic material and a heat sink ceramic material, and wherein the heat sink ceramic material is a portion of the container inner surface and the heat source ceramic material is a portion of the container outer surface.

Embodiment 4. The thermoelectric charger of one or more of embodiments 1-11, wherein the heat sink ceramic material is an inner most portion of the container inner surface; or wherein the heat source ceramic material is an outer most portion of the container outer surface; or wherein the heat sink ceramic material is positioned directly beneath at least a layer of the inner most portion of the container inner surface; or wherein the heat source ceramic material is positioned directly beneath an outer most layer of the container outer surface.

Embodiment 5. The thermoelectric charger of one or more of embodiments 1-11, wherein the at least one thermoelectric generator includes at least one n-type semiconductor and at least one p-type semiconductor located between a heat source ceramic material and a heat sink ceramic material, and wherein the heat source ceramic material is a portion of the container inner surface and the heat sink ceramic material is a portion of the container outer surface.

Embodiment 6. The thermoelectric charger of one or more of embodiments 1-11, wherein the heat source ceramic material is an inner most portion of the container inner surface; or wherein the heat sink ceramic material is an outer most portion of the container outer surface; or wherein the heat source ceramic material is positioned directly beneath at least a layer of the inner most portion of the container inner surface; or wherein the heat sink ceramic material is positioned directly beneath an outer most layer of the container outer surface.

Embodiment 7. The thermoelectric charger of one or more of embodiments 1-11, wherein the power converter includes a direct current (DC) DC-DC power converter, wherein the DC-DC power converter has an input range of from about 0.01 V to about 12 V; or wherein the DC-DC power converter has an input range of from about 0.01 V to about 6 V; or wherein the DC-DC power converter has an input range of from about 0.01 V to about 3 V.

Embodiment 8. The thermoelectric charger of one or more of embodiments 1-11, wherein the power port includes one or more of a power socket, a power plug, a power charger, a power adapter, a power cord, a battery charger, or a power outlet, or a universal serial bus (USB) port, or combinations thereof.

Embodiment 9. The thermoelectric charger of one or more of embodiments 1-11, wherein the container bottom connects to the at least one container side and the container bottom and the at least one container side are impermeable to an aqueous fluid, and wherein the at least one of the container bottom and the at least one container side include a container inner material, a container outer material, and a thermally insulating layer located between the container inner material and the container outer material, and wherein the thermally insulated container is impermeable to the aqueous fluid when the at least a portion of the container top is reversibly sealed to the thermally insulated container.

Embodiment 10. The thermoelectric charger of one or more of embodiments 1-11, wherein the at least one thermoelectric generator includes an array of thermoelectric generators, wherein the array of thermoelectric generators includes from 2 thermoelectric generators to about 8 thermoelectric generators electrically connected in series and a closed loop to the power converter, and wherein the array of thermoelectric generators, or a portion of the array of thermoelectric generators, is embedded in the container top, the container bottom, or the at least one container side.

Embodiment 11. The thermoelectric charger of one or more of embodiments 1-11, wherein the at least one thermoelectric generator includes an array of thermoelectric generators, wherein at least half of the array of thermoelectric generators have a shape of rectangular tiles having a length of about 10.0 to about 100.0 mm, a width of about 10.0 to about 100.0 mm, and a height of about 3.0 mm to about 8.0 mm; or wherein the array of thermoelectric generators is capable of generating a voltage of about 3.0 V to about 8.0 V at 30° C., when there is a 50° C. difference in temperature between a content of the thermally insulated container and an ambient environment.

Embodiment 12. A method of charging an electronic device comprising:

providing a thermoelectric charger, wherein the thermoelectric charger includes at least one thermoelectric generator embedded within at least one surface of a thermally insulated container;

wherein the at least one thermoelectric generator is electrically connected to a power converter; and wherein the power converter is electrically connected to a power port;

wherein the thermally insulated container includes a container top, a container bottom, and at least one container side, and the at least one surface includes a container inner surface and a container outer surface; and wherein at least a portion of the container top can be reversibly sealed to the thermally insulated container;

electrically connecting the electronic device to the power port; and providing a temperature differential of from about 50° C. to about 80° C. between the container inner surface and the container outer surface by contacting the container inner surface with a substance.

Embodiment 13. The method of one or more of embodiments 12-14, wherein the substance is a hot substance having a temperature ranging from about 75.0° C. to about 102.0° C.; or wherein the substance is a hot substance that includes an aqueous solution having a temperature ranging from about 80.0° C. to about 102.0° C.; or wherein the substance is a cold substance having a temperature ranging from about −11° C. to about 25.0° C.; or wherein the substance is a cold substance that includes an aqueous solution or aqueous slurry having a temperature ranging from about −5.0° C. to about 25.0° C.

Embodiment 14. The method of one or more of embodiments 12-14, wherein the electronic device is one or more of a light source, a mobile device, a cell phone, a laptop, a computer tablet, a battery recharger, a battery, a flashlight, or a combination thereof.

EXAMPLES

A thermally insulated container was provided, namely, a conventional ice cooler (COLEMAN®). 4 square-shaped openings (40 mm×40 mm each) were cut into the lid of the cooler. 4 thermoelectric modules (COMIMARK® 40×40 mm Thermoelectric Power Generator SP1848-27145 Peltier TEG Module) were fixed into the openings and connected by electrical wires, such that the heat sink side and heat source side of the thermoelectric modules were directly exposed to the interior and exterior environments of the cooler, respectively.

The 4 thermoelectric modules were connected by the electrical wires in series to form a closed circuit with a DC-DC power converter E-Outstanding PFM Control DC-DC 0.9V-5V to USB 5V Boost Step-up Power Supply Module Booster Circuit Board (Amazon, Brand E-outstanding). The DC-DC power converter was connected to a USB port inserted through another opening cut into the surface of the top of the insulated container.

A slurry of ice and water was used to fill the container and a light emitting diode was connected to the USB port and illuminated by the difference in temperature between the interior and exterior of the cooler.

What is claimed is:

1. A thermoelectric charger comprising:
at least one thermoelectric generator embedded within at least one surface of a thermally insulated container;
wherein the at least one thermoelectric generator is electrically connected to a power converter;
wherein the power converter is electrically connected to a power port;
wherein the thermally insulated container includes a container top, a container bottom, and at least one container side, and the at least one surface includes a container inner surface and a container outer surface;
wherein the container top is reversibly sealed to the thermally insulated container; and
wherein the thermally insulated container is impermeable to liquids and gasses.

2. The thermoelectric charger of claim 1, wherein the at least one thermoelectric generator includes an array of at least 2 thermoelectric generators electrically connected in series to the power converter.

3. The thermoelectric charger of claim 1,
wherein the at least one thermoelectric generator includes at least one n-type semiconductor and at least one p-type semiconductor located between a heat source ceramic material and a heat sink ceramic material, and
wherein the heat sink ceramic material is a portion of the container inner surface and the heat source ceramic material is a portion of the container outer surface.

4. The thermoelectric charger of claim 3,
wherein the heat sink ceramic material is an inner most portion of the container inner surface; or
wherein the heat source ceramic material is an outer most portion of the container outer surface; or
wherein the heat sink ceramic material is positioned directly beneath at least a layer of the inner most portion of the container inner surface; or
wherein the heat source ceramic material is positioned directly beneath an outer most layer of the container outer surface.

5. The thermoelectric charger of claim 1,
wherein the power converter includes a direct current (DC) DC-DC power converter,
wherein the DC-DC power converter has an input range of from about 0.01 V to about 12 V; or
wherein the DC-DC power converter has an input range of from about 0.01 V to about 6 V; or
wherein the DC-DC power converter has an input range of from about 0.01 V to about 3 V.

6. The thermoelectric charger of claim 1, wherein the power port includes one or more of a power socket, a power plug, a power charger, a power adapter, a power cord, a battery charger, or a power outlet, or a universal serial bus port, or combinations thereof.

7. The thermoelectric charger of claim 1,
wherein the container bottom connects to the at least one container side and the container bottom and the at least one container side are impermeable to an aqueous fluid, and
wherein the at least one of the container bottom and the at least one container side include a container inner material, a container outer material, and a thermally insulating layer located between the container inner material and the container outer material, and
wherein the thermally insulated container is impermeable to the aqueous fluid and gasses when the container top is reversibly sealed to the thermally insulated container.

8. The thermoelectric charger of claim 2,
wherein the array of thermoelectric generators, or a portion of the array of thermoelectric generators, is embedded in the container bottom or the at least one container side.

9. The thermoelectric charger of claim 2,
wherein at least half of the array of thermoelectric generators have a shape of rectangular tiles having a length of about 10.0 to about 100.0 mm, a width of about 10.0 to about 100.0 mm, and a height of about 3.0 mm to about 8.0 mm.

10. A thermoelectric charger comprising:
at least one thermoelectric generator embedded within at least one surface of a thermally insulated container;
wherein the at least one thermoelectric generator is electrically connected to a power converter;
wherein the power converter is electrically connected to a power port;
wherein the thermally insulated container includes a container top, a container bottom, and at least one container side, and the at least one surface includes a container inner surface and a container outer surface; and wherein the container top is reversibly sealed to the thermally insulated container, and wherein the container bottom connects to the at least one container side and the container bottom and the at least one container side are impermeable to liquids, and wherein the at least one of the container bottom and the at least one container side include a container inner material, a container outer material, and a thermally insulating layer located between the container inner material and the container outer material, and wherein the thermally insulated container is impermeable to liquids and gasses when the container top is reversibly sealed to the thermally insulated container.

11. The thermoelectric charger of claim 1, wherein the at least one thermoelectric generator includes an array of thermoelectric generators, and wherein the array of thermoelectric generators is capable of generating a voltage of about 3.0 V to about 8.0 V when an ambient environment is at 30° C. and there is a 50° C. difference in temperature between a content of the thermally insulated container and the ambient environment.

12. The thermoelectric charger of claim 1, wherein the at least one thermoelectric generator is configured to produce an electrical current when there is a temperature difference between the ambient environment and an interior of the thermally insulated container, and the thermoelectric charger further comprising a liquid stored within the thermally insulated container, wherein the liquid increases the temperature difference.

13. A thermoelectric charger comprising:

at least one thermoelectric generator embedded within at least one surface of a thermally insulated container;

wherein the at least one thermoelectric generator is electrically connected to a power converter;

wherein the power converter is electrically connected to a power port;

wherein the thermally insulated container includes a container top, a container bottom, and at least one container side, and the at least one surface includes a container inner surface and a container outer surface;

wherein the container top is reversibly sealed to the thermally insulated container; and wherein the container top completely seals the thermally insulated container.

* * * * *